United States Patent
Cha (10) Patent No.: US 9,595,305 B1
(45) Date of Patent: Mar. 14, 2017

(54) SEMICONDUCTOR DEVICES

(71) Applicant: SK hynix Inc., Icheon-si, Gyeonggi-do (KR)

(72) Inventor: Jae Hoon Cha, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/229,389

(22) Filed: Aug. 5, 2016

(30) Foreign Application Priority Data

Mar. 3, 2016 (KR) .................. 10-2016-0025839

(51) Int. Cl.
*G11C 7/00* (2006.01)
*G11C 7/12* (2006.01)
*G11C 7/22* (2006.01)
*G11C 7/10* (2006.01)

(52) U.S. Cl.
CPC .............. *G11C 7/12* (2013.01); *G11C 7/10* (2013.01); *G11C 7/222* (2013.01)

(58) Field of Classification Search
USPC ........................... 365/203, 194, 204
See application file for complete search history.

(56) References Cited

U.S. PATENT DOCUMENTS

| 8,033,139 | B2 * | 10/2011 | Lee | .................. | G11C 8/12 |
| | | | | | 365/194 |
| 2009/0180341 | A1 | 7/2009 | Ide et al. | | |
| 2010/0157712 | A1 * | 6/2010 | Kim | ............... | G11C 11/406 |
| | | | | | 365/222 |

FOREIGN PATENT DOCUMENTS

KR  1020140084969 A  7/2014

* cited by examiner

*Primary Examiner* — Vu Le
(74) *Attorney, Agent, or Firm* — William Park & Associates Ltd.

(57) ABSTRACT

A semiconductor device may be provided. The semiconductor device may include a pre-charge pulse signal generation circuit configured to generate a pre-charge pulse signal based on the period control signal and a word line off signal. The enablement of the pre-charge pulse signal may be delayed based on the enablement of the word line off signal.

20 Claims, 6 Drawing Sheets

SEMICONDUCTOR DEVICES

CROSS-REFERENCE TO RELATED APPLICATIONS

The present application claims priority under 35 U.S.C. 119(a) to Korean Patent Application No. 10-2016-0025839, filed on Mar. 3, 2016, which is incorporated herein by reference in its entirety.

BACKGROUND

1. Technical Field

Embodiments of the present disclosure may generally relate to semiconductor devices and a bit line pre-charge operation.

2. Related Art

Semiconductor memory devices may include a plurality of memory cells in which data are stored. The Semiconductor memory devices may also include word lines and bit lines which are used to select at least one of the plurality of memory cells and/or to transmit the data during a read operation or a write operation. The bit lines may be always pre-charged to have a predetermined voltage level in advance of the read operation or the write operation. That is, the bit lines may be pre-charged to a half of a core voltage before access of the data in order to reduce an access time.

As the plurality of memory cells are scaled down to increase the integration density of the semiconductor memory devices, a size of connection nodes between the bit lines and the memory cells has been continuously reduced. If the size of the connection nodes is reduced, a contact resistance value between the bit lines and the memory cells may increase. Due to the increase in the contact resistance value some characteristics (e.g., a data access time or a data write time) of the semiconductor memory devices are degraded. That is, if the contact resistance value between the bit lines and the memory cells increases, the data access time or the data write time of the semiconductor memory devices may also increase. Thus, it may be necessary to increase an activation time of any one selected from the word lines in order to stably store the data into selected memory cells. However, if the activation time of the word line increases, a pre-charge period of the bit lines may be reduced.

SUMMARY

According to an embodiment, a semiconductor device may be provided. The semiconductor device may include a pre-charge pulse signal generation circuit configured to generate a pre-charge pulse signal based on the period control signal and a word line off signal. The enablement of the pre-charge pulse signal may be delayed based on the enablement of the word line off signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices controlling a pre-charging operation of bit lines.

Figure 1:
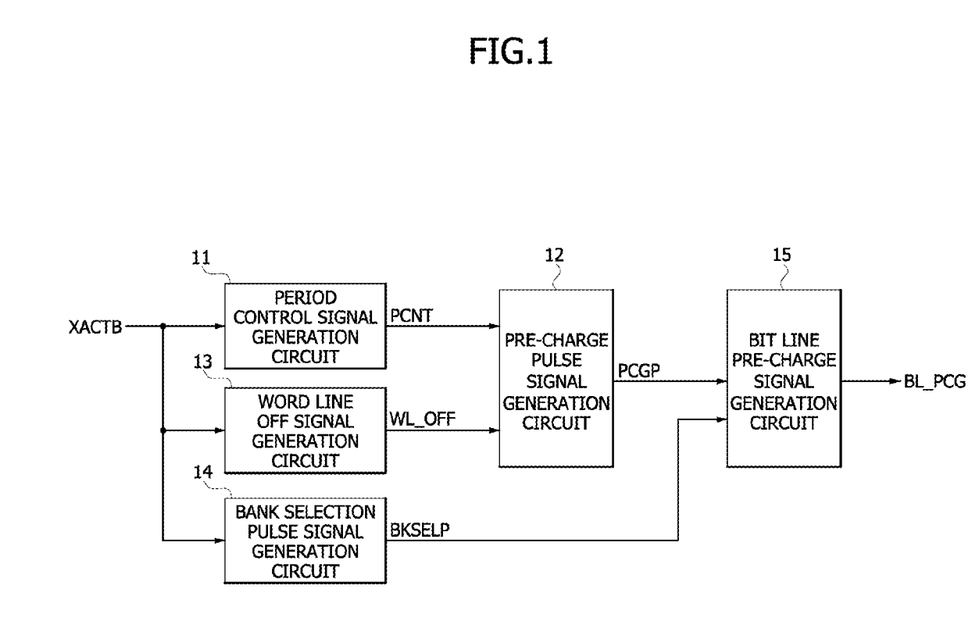
FIG. 1 is a block diagram illustrating a representation of an example of a semiconductor device according to an embodiment of the present disclosure.

Referring to FIG. 1, a semiconductor device according to an embodiment may be configured to include a period control signal generation circuit 11, a pre-charge pulse signal generation circuit 12, a word line off signal generation circuit 13, a bank selection pulse signal generation circuit 14 and a bit line pre-charge signal generation circuit 15.

The period control signal generation circuit 11 may delay a pre-charge period signal XACTB by a first period to generate a period control signal PCNT. The period control signal PCNT may be generated to control a point of time that a pre-charge pulse signal PCGP is disabled. The first period may be set such that the period control signal PCNT is disabled earlier than a point of time that a pulse of a bank selection pulse signal BKSELP is generated. The period control signal generation circuit 11 may be realized using an inverter chain that delays the pre-charge period signal XACTB by the first period.

The pre-charge pulse signal generation circuit 12 may generate the pre-charge pulse signal PCGP in response to the period control signal PCNT and a word line off signal WL_OFF. The pre-charge pulse signal generation circuit 12 may generate the pre-charge pulse signal PCGP which is enabled after a second period elapses from a point of time that the word line off signal WL_OFF is enabled. The pre-charge pulse signal generation circuit 12 may generate the pre-charge pulse signal PCGP which is disabled in synchronization with a point of time that the period control signal PCNT is disabled. The second period may be set such that the pre-charge pulse signal PCGP is generated after a selected word line (not illustrated) is completely inactivated in response to the word line off signal WL_OFF.

The word line off signal generation circuit 13 may delay the pre-charge period signal XACTB by a third period to generate the word line off signal WL_OFF. The word line off signal generation circuit 13 may generate the word line off signal WL_OFF which is enabled after the third period elapses from a point of time that the pre-charge period signal XACTB is enabled. The word line off signal generation circuit 13 may generate the word line off signal WL_OFF which is disabled in synchronization with a point of time that the pre-charge period signal XACTB is disabled. The word line off signal WL_OFF may control a point of time that the selected word line (not illustrated) is disabled. The word line off signal generation circuit 13 may control the disablement moment of the selected word line (not illustrated) by adjusting the third period. If a length of the third period increases, an enablement period of the selected word line (not illustrated) may become longer because an enablement moment of the word line off signal WL_OFF is delayed. If an enablement period of the selected word line (not illustrated) becomes longer, a time for storing data into memory cells (not illustrated) may increase to improve a write recovery time tWR.

The bank selection pulse signal generation circuit 14 may generate the bank selection pulse signal BKSELP after a fourth period elapses from a point of time that the pre-charge period signal XACTB is disabled. The pre-charge period signal XACTB may be enabled in a pre-charge period. The pre-charge period signal XACTB may be enabled at a point of time that a pre-charge command (not illustrated) is inputted and may be disabled at a point of time that an active command (not illustrated) is inputted. The pre-charge command (not illustrated) may be provided from an external device to execute a pre-charge operation of the semiconductor device. The active command (not illustrated) may also be provided from the external device to execute an active operation of the semiconductor device. In some embodiments, the pre-charge period signal XACTB may be replaced with an active period signal which is enabled in an active period. The bank selection pulse signal BKSELP may terminate a bit line pre-charge operation that pre-charges bit lines (not illustrated) and may enable the selected word line (not illustrated). The fourth period may be set to be a period from a point of time that the active command (not illustrated) is inputted till a point of time that selected word line (not illustrated) is enabled.

The bit line pre-charge signal generation circuit 15 may generate a bit line pre-charge signal BL_PCG in response to the pre-charge pulse signal PCGP and the bank selection pulse signal BKSELP. The bit line pre-charge signal generation circuit 15 may generate the bit line pre-charge signal BL_PCG which is enabled in response to the pre-charge pulse signal PCGP and is disabled in response to the bank selection pulse signal BKSELP. The bit line pre-charge signal BL_PCG may be enabled to pre-charge the bit lines (not illustrated).

Figure 2:
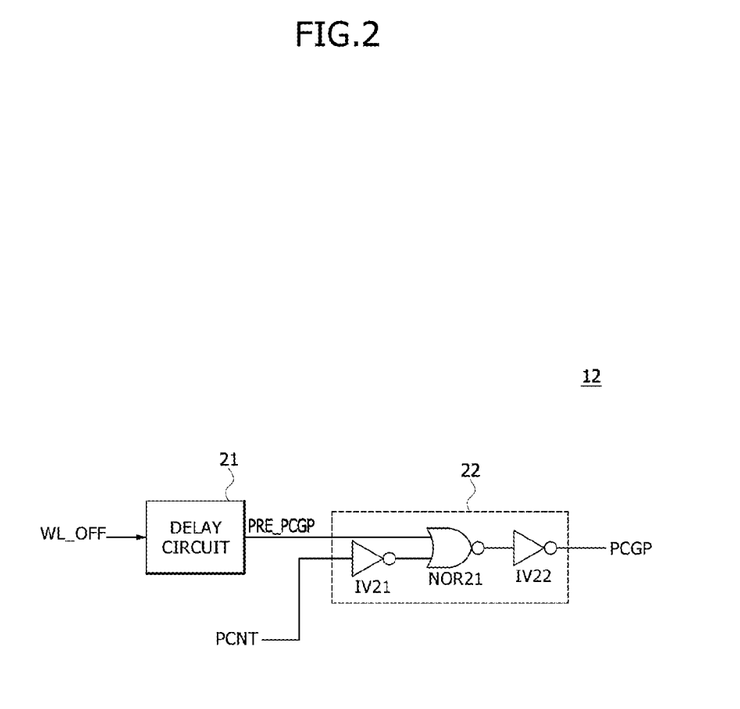
FIG. 2 is a block diagram illustrating a representation of an example of a pre-charge pulse signal generation circuit included in the semiconductor device of FIG. 1.

Referring to FIG. 2, the pre-charge pulse signal generation circuit 12 may include a delay circuit 21 and a logic circuit 22.

The delay circuit 21 may delay the word line off signal WL_OFF by the second period to generate a pre-precharge pulse signal PRE_PCGP. The delay circuit 21 may be realized using an inverter chain that delays the word line off signal WL_OFF by the second period.

The logic circuit 22 may include inverters IV21 and IV22 and a logic gate, for example, a NOR gate NOR21. The inverter IV21 may inversely buffer the period control signal PCNT to output the inversely buffered signal. The NOR gate NOR21 may execute a NOR operation of the pre-precharge pulse signal PRE_PCGP and an output signal of the inverter IV21 to output a result of the NOR operation. The inverter IV22 may inversely buffer an output signal of the NOR gate NOR21 to generate the pre-charge pulse signal PCGP. The logic circuit 22 may enable the pre-charge pulse signal PCGP in synchronization with a point of time that the pre-precharge pulse signal PRE_PCGP is enabled and may disable the pre-charge pulse signal PCGP in synchronization with a point of time that the period control signal PCNT is disabled. That is, the pre-charge pulse signal PCGP may have a pulse width from a point of time that the pre-precharge pulse signal PRE_PCGP is enabled till a point of time that the period control signal PCNT is disabled.

Figure 3:
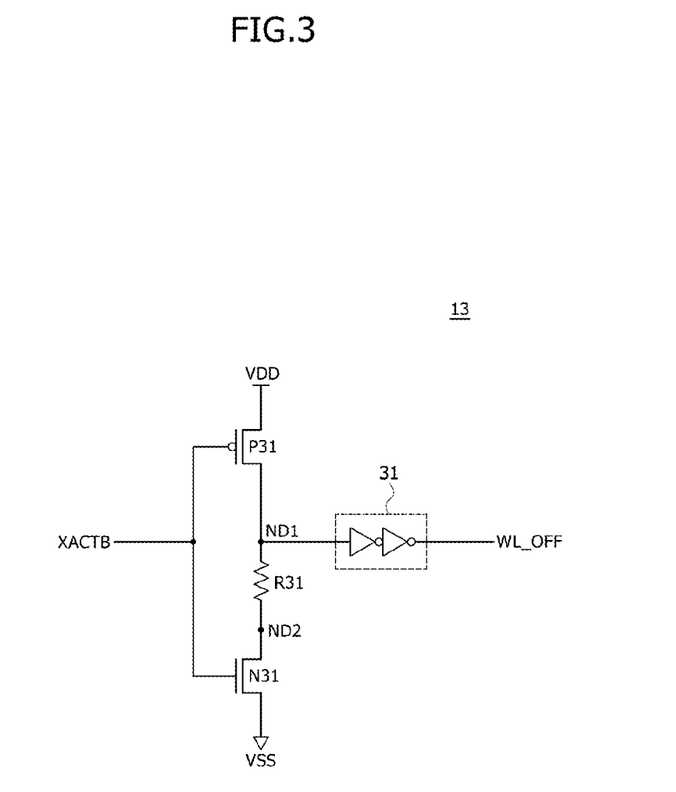
FIG. 3 is a circuit diagram illustrating a representation of an example of a word line off signal generation circuit included in the semiconductor device of FIG. 1.

Referring to FIG. 3, the word line off signal generation circuit 13 may include a PMOS transistor P31, a resistive element R31, an NMOS transistor N31 and a buffer 31. The PMOS transistor P31 may be coupled between a power supply voltage VDD terminal and a first node ND1 and may be turned on in response to the pre-charge period signal XACTB. The resistive element R31 may be coupled between the first node ND1 and a second node ND2. The NMOS transistor N31 may be coupled between the second node ND2 and a ground voltage VSS terminal and may be turned on in response to the pre-charge period signal XACTB. The buffer 31 may buffer a signal of the first node ND1 to generate the word line off signal WL_OFF. If the word line off signal generation circuit 13 receives the pre-charge period signal XACTB which is disabled to have a logic "low" level, the PMOS transistor P31 may be turned on to pull up the first node ND1 to the power supply voltage VDD. The word line off signal generation circuit 13 may buffer a signal of the first node ND1 driven to the power supply voltage VDD to generate the word line off signal WL_OFF having a logic "high" level. If the word line off signal generation circuit 13 receives the pre-charge period signal XACTB which is enabled to have a logic "high" level, the NMOS transistor N31 may be turned on to pull down the first node ND1 to the ground voltage VSS. In such a case, the first node ND1 may be pulled down to the ground voltage VSS after the third period elapses from a point of time that the pre-charge period signal XACTB having a logic "high" level is inputted to the word line off signal generation circuit 13 because of the presence of the resistive element R31. The third period may be controlled according to a resistance value of the resistive element R31. The word line off signal generation circuit 13 may buffer a signal of the first node ND1 to generate the word line off signal WL_OFF having a logic "low" level, after the first node ND1 is pulled down to the ground voltage VSS.

Figure 4:
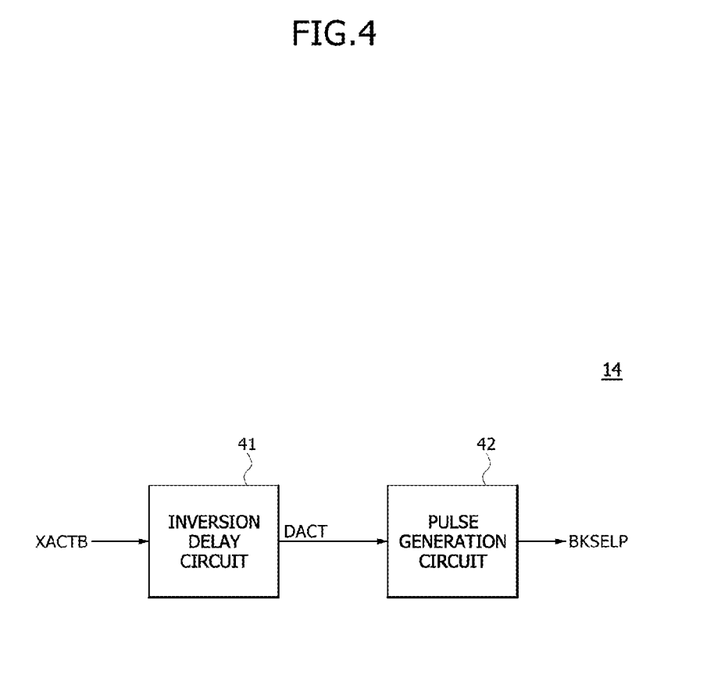
FIG. 4 is a block diagram illustrating a representation of an example of a bank selection pulse signal generation circuit included in the semiconductor device of FIG. 1.

Referring to FIG. 4, the bank selection pulse signal generation circuit 14 may include an inversion delay circuit 41 and a pulse generation circuit 42.

The inversion delay circuit 41 may invert the pre-charge period signal XACTB and may delay a complementary signal of the pre-charge period signal XACTB by the fourth period to generate a delayed period signal DACT. The inversion delay circuit 41 may be realized using an inverter chain to invert the pre-charge period signal XACTB and to delay the complementary signal of the pre-charge period signal XACTB by the fourth period.

The pulse generation circuit 42 may generate the bank selection pulse signal BKSELP in response to the delayed period signal DACT. The pulse generation circuit 42 may generate the bank selection pulse signal BKSELP having a predetermined pulse width at a point of time that the delayed period signal DACT is disabled.

Figure 5:
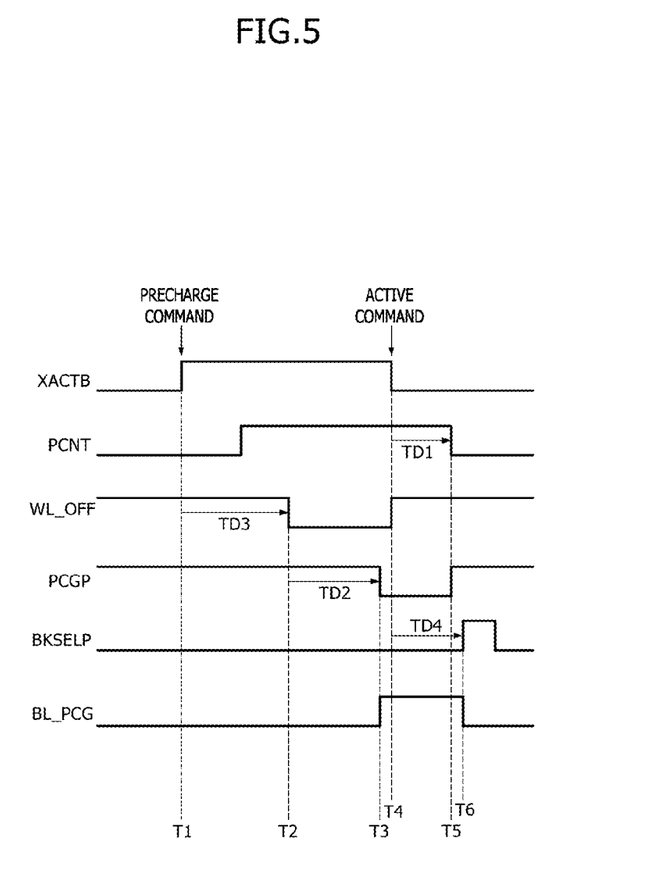
FIG. 5 is a timing diagram illustrating a representation of an example of an operation of a semiconductor device illustrated in FIGS. 1 to 4.

An example of an operation of the semiconductor device having an aforementioned configuration will be described hereinafter with reference to FIG. 5.

First, the pre-charge period signal XACTB may be enabled to have a logic "high" level at a point of time "T1" that the pre-charge command is inputted and may be disabled to have a logic "low" level at a point of time "T4" that the active command is inputted.

The period control signal PCNT may be generated by delaying the pre-charge period signal XACTB by a first period TD1. The period control signal PCNT may be disabled at a point of time "T5" that the first period TD1 elapses from the point of time "T4" that the pre-charge period signal XACTB is disabled to have a logic "low" level. The first period TD1 may be set such that the period control signal PCNT is disabled at the point of time "T5" which is earlier than a point of time "T6" that the bank selection pulse signal BKSELP is generated.

The word line off signal WL_OFF may be enabled to have a logic "low" level at a point of time "T2" that a third period TD3 elapses from the point of time "T1" that the pre-charge period signal XACTB is enabled to have a logic "high" level. The word line off signal WL_OFF may be disabled to have a logic "high" level in synchronization with the point of time "T4" that the pre-charge period signal XACTB is disabled to have a logic "low" level.

The pre-charge pulse signal PCGP may be enabled at a point of time "T3" that a second period TD2 elapses from the point of time "T2" that the word line off signal WL_OFF is enabled to have a logic "low" level. The pre-charge pulse signal PCGP may be disabled to have a logic "high" level in synchronization with the point of time "T5" that the period control signal PCNT is disabled to have a logic "low" level. The second period TD2 may be set such that the pre-charge pulse signal PCGP is generated after the selected word line (not illustrated) is completely inactivated by the word line off signal WL_OFF.

The bank selection pulse signal BKSELP may be generated to have a predetermined pulse width at the point of time "T6" that a fourth period TD4 elapses from a point of time "T4" that the pre-charge period signal XACTB is disabled to have a logic "low" level. The first period TD1 may be set to be shorter than the fourth period TD4.

The bit line pre-charge signal BL_PCG may be enabled to have a logic "high" level in synchronization with the point of time "T3" that the pre-charge pulse signal PCGP is enabled to have a logic "low" level. The bit line pre-charge signal BL_PCG may be disabled in synchronization with the point of time "T6" that a pulse of the bank selection pulse signal BKSELP is generated. The bit line pre-charge signal BL_PCG may be enabled during a period that the bit lines (not illustrated) are pre-charged.

As described above, the pre-charge pulse signal PCGP may be enabled at a point of time that the word line off signal WL_OFF is delayed by the second period TD2 and may be disabled in synchronization with a point of time that the period control signal PCNT is disabled. The pre-charge pulse signal PCGP may be disabled in synchronization with the period control signal PCNT which is disabled earlier than a point of time that a pulse of the bank selection pulse signal BKSELP is generated. Thus, the pre-charge pulse signal PCGP may have a maximum pulse width from a point of time that the word line off signal WL_OFF is delayed by the second period TD2 till a point of time before the bank selection pulse signal BKSELP is generated. If the point of time "T2" that the word line off signal WL_OFF is enabled is delayed to improve the write recovery time tWR, the point of time "T3" that the pre-charge pulse signal PCGP is enabled may also be delayed. Nevertheless, the pre-charge pulse signal PCGP may have a maximum pulse width because the pre-charge pulse signal PCGP is disabled just before the bank selection pulse signal BKSELP is generated. Thus, the pre-charge pulse signal PCGP may have a sufficient pulse width to prevent malfunction of the bit line pre-charge operation.

Figure 6:
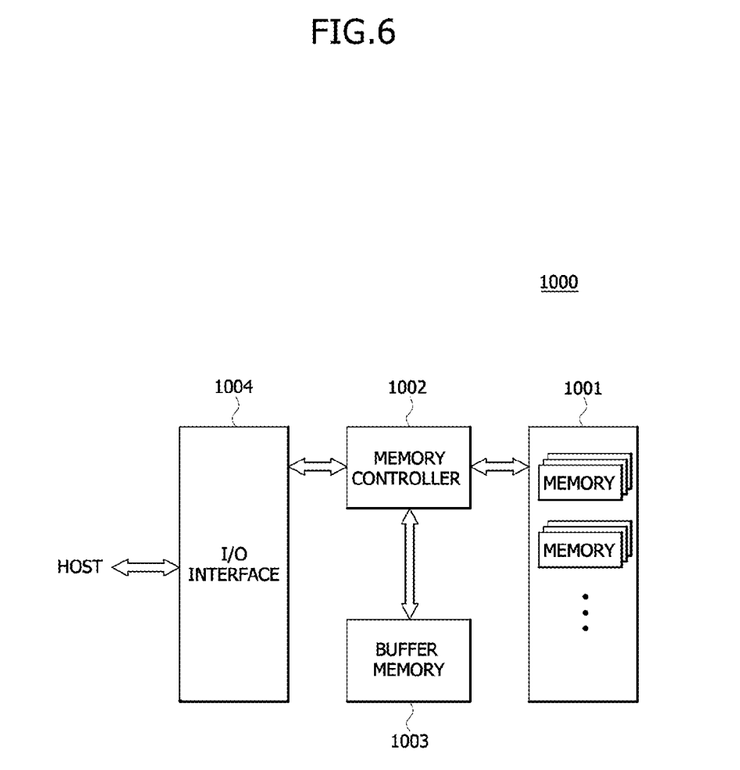
FIG. 6 is a block diagram illustrating a representation of an example of a configuration of an electronic system employing a semiconductor device illustrated in FIGS. 1 to 5.

The semiconductor devices described with reference to FIGS. 1 to 5 may be applied to an electronic system that may include a memory system, a graphic system, a computing system, a mobile system, or the like. For example, as illustrated in FIG. 6, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 6 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, a static random access memory (SRAM), or the like.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a period control signal generation circuit configured to delay a pre-charge period signal by a first period to generate a period control signal; and
    a pre-charge pulse signal generation circuit configured to generate a pre-charge pulse signal based on the period control signal and a word line off signal,
    wherein the pre-charge pulse signal is enabled after a second period elapses from a point of time that the word line off signal is enabled, and
    wherein the pre-charge pulse signal is disabled in synchronization with a point of time that the period control signal is disabled.

2. The semiconductor device of claim 1, wherein a duration of an enablement period of the pre-charge period signal is based on the input of a pre-charge command and an active command.

3. The semiconductor device of claim 1, wherein the word line off signal controls a point of time that a word line is disabled.

4. The semiconductor device of claim 1, wherein the pre-charge pulse signal controls a point of time that a bit line pre-charge operation starts.

5. The semiconductor device of claim 1, wherein the pre-charge pulse signal generation circuit includes:
    a delay circuit configured to delay the word line off signal by the second period to generate a pre-precharge pulse signal; and
    a logic circuit configured to control a disablement moment of the pre-precharge pulse signal based on the period control signal to generate the pre-charge pulse signal.

6. The semiconductor device of claim 1, further comprising a word line off signal generation circuit configured to delay the pre-charge period signal by a third period to generate the word line off signal.

7. The semiconductor device of claim 6, wherein the word line off signal generation circuit includes:
    a first MOS transistor coupled between a first supply voltage terminal and a first node and turned on based on the pre-charge period signal;
    a resistive element coupled between the first node and a second node;
    a second MOS transistor coupled between the second node and a second supply voltage terminal and turned on based on the pre-charge period signal; and
    a buffer configured to buffer a signal of the first node to generate the word line off signal.

8. The semiconductor device of claim 7, wherein the third period is controlled by a resistance value of the resistive element.

9. The semiconductor device of claim 1, further comprising:
    a bank selection pulse signal generation circuit configured to generate a bank selection pulse signal after a fourth period elapses from a point of time that the pre-charge period signal is disabled; and
    a bit line pre-charge signal generation circuit configured to generate a bit line pre-charge signal which is enabled based on the pre-charge pulse signal and is disabled based on the bank selection pulse signal.

10. The semiconductor device of claim 9, wherein the first period is shorter than the fourth period.

11. A semiconductor device comprising:
    a word line off signal generation circuit configured to delay a pre-charge period signal to generate a word line off signal; and
    a pre-charge pulse signal generation circuit configured to delay the word line off signal to generate a pre-charge pulse signal,
    wherein the pre-charge pulse signal is disabled based on a period control signal which is generated by delaying the pre-charge period signal by a first period.

12. The semiconductor device of claim 11, wherein the pre-charge pulse signal is enabled at a point of time that the word line off signal is delayed by a second period.

13. The semiconductor device of claim 11, wherein a duration of an enablement period of the pre-charge period signal is based on the input of a pre-charge command and an active command.

14. The semiconductor device of claim 11, wherein the word line off signal controls a point of time that a word line is disabled.

15. The semiconductor device of claim 11, wherein the pre-charge pulse signal controls a point of time that a bit line pre-charge operation starts.

16. The semiconductor device of claim 11, wherein the word line off signal generation circuit includes:
    a first MOS transistor coupled between a first supply voltage terminal and a first node and turned on based on the pre-charge period signal;
    a resistive element coupled between the first node and a second node;
    a second MOS transistor coupled between the second node and a second supply voltage terminal and turned on based on the pre-charge period signal; and
    a buffer configured to buffer a signal of the first node to generate the word line off signal.

17. The semiconductor device of claim 16, wherein the word line off signal is generated by delaying the pre-charge period signal by a third period; and
    wherein the third period is controlled by a resistance value of the resistive element.

18. The semiconductor device of claim 11, wherein the pre-charge pulse signal generation circuit includes:
    a delay circuit configured to delay the word line off signal by a second period to generate a pre-precharge pulse signal; and
    a logic circuit configured to control a disablement moment of the pre-precharge pulse signal based on the period control signal to generate the pre-charge pulse signal.

19. The semiconductor device of claim 11, further comprising:
    a bank selection pulse signal generation circuit configured to generate a bank selection pulse signal after a fourth period elapses from a point of time that the pre-charge period signal is disabled; and
    a bit line pre-charge signal generation circuit configured to generate a bit line pre-charge signal which is enabled based on the pre-charge pulse signal and is disabled based on the bank selection pulse signal.

20. The semiconductor device of claim 19, wherein the first period is shorter than the fourth period.

* * * * *